United States Patent [19]
Kiser

[11] Patent Number: 5,867,069
[45] Date of Patent: Feb. 2, 1999

[54] ORTHOGONALLY MOUNTED SUBSTRATE BASED RESONATORS

[75] Inventor: Joseph H. Kiser, Aurora, Colo.

[73] Assignee: Vari-L Company, Inc., Denver, Colo.

[21] Appl. No.: 93,763

[22] Filed: Jun. 9, 1998

Related U.S. Application Data

[60] Provisional application No. 60/049,191 Jun. 11, 1997.
[51] Int. Cl.$^6$ .................................. H01P 7/08; H03B 5/18
[52] U.S. Cl. ......................... 331/96; 331/117 D; 333/219; 333/235
[58] Field of Search ........................ 331/96, 99, 107 DP, 331/107 SL, 117 D; 333/219, 220, 221, 235, 246

[56] References Cited

U.S. PATENT DOCUMENTS

| | | | |
|---|---|---|---|
| 4,757,286 | 7/1988 | Konishi et al. | 333/204 |
| 5,031,072 | 7/1991 | Malhi et al. | 361/387 |
| 5,227,739 | 7/1993 | Mandai et al. | 331/96 |
| 5,545,924 | 8/1996 | Contolatis et al. | 257/724 |

*Primary Examiner*—Siegfried H. Grimm
*Attorney, Agent, or Firm*—Ancel W. Lewis, Jr.

[57] ABSTRACT

A resonator includes a substrate to which are attached trimmable capacitance and inductance portions which together with a varactor and transistor form an oscillator circuit. The substrate mounts orthogonally in a slot on an oscillator board to reduce microphonic effects from a cover that otherwise would degrade the oscillator performance.

18 Claims, 3 Drawing Sheets

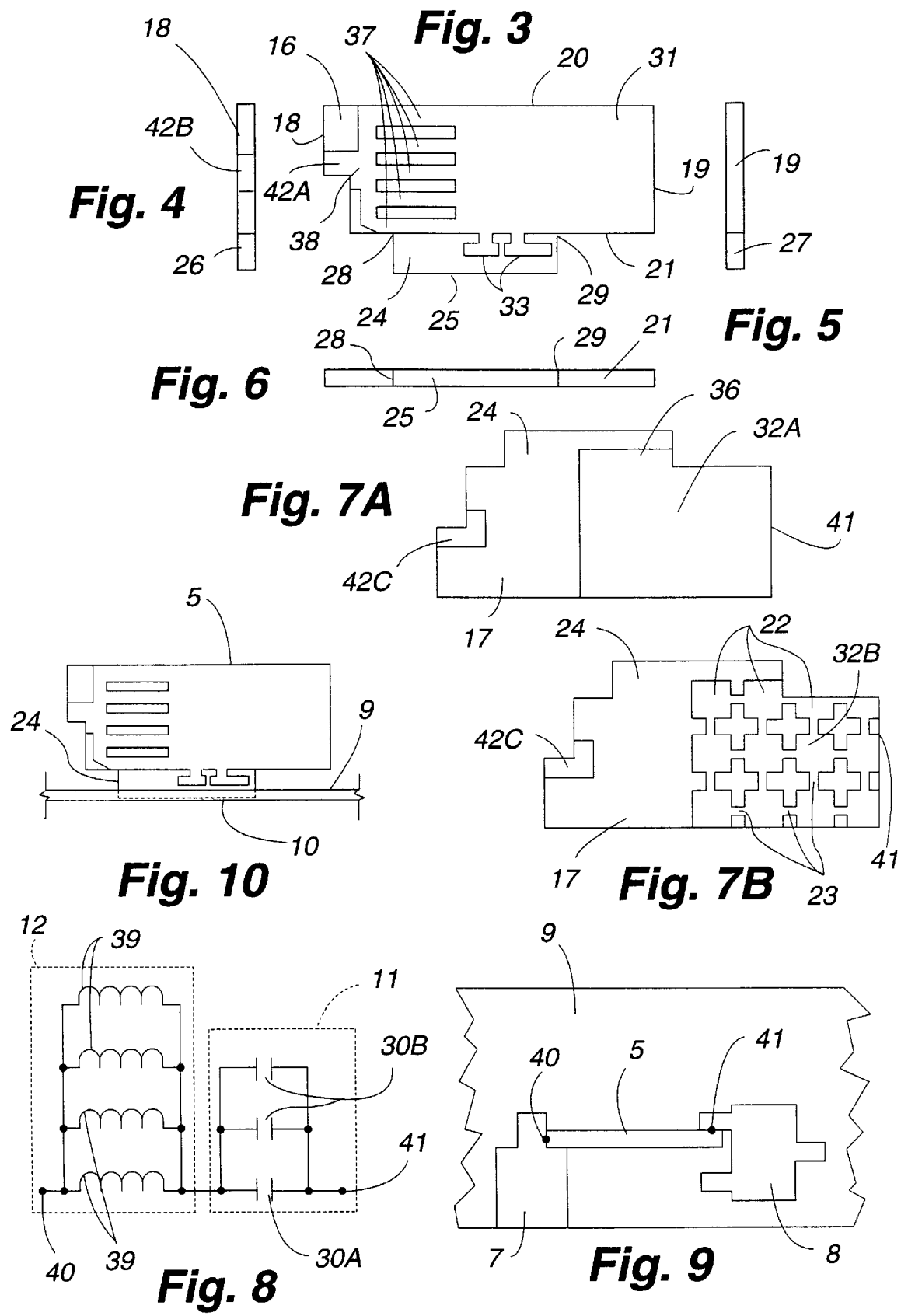

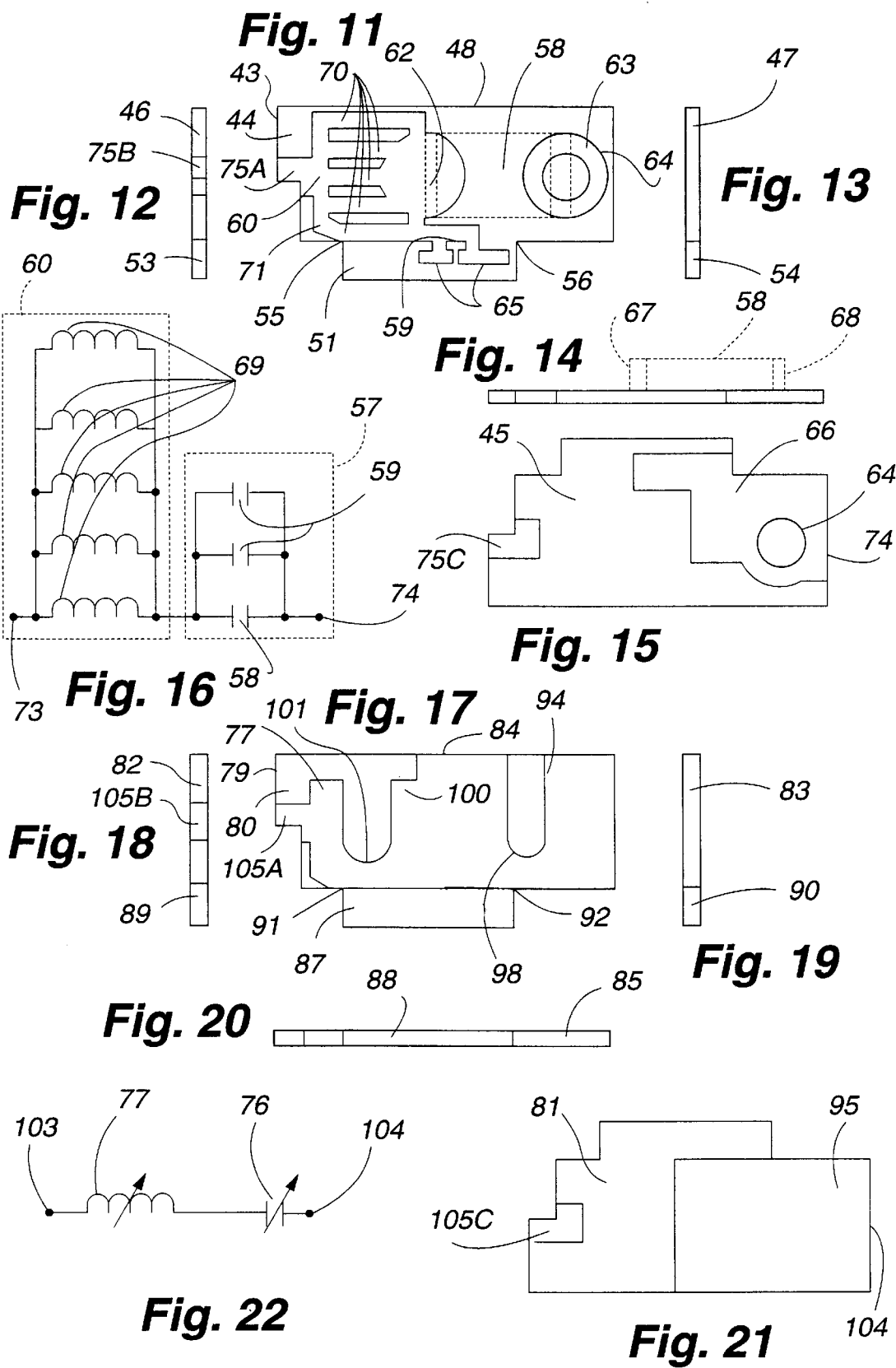

ORTHOGONALLY MOUNTED SUBSTRATE BASED RESONATORS

This application claims the benefit of U.S. Provisional Application No. 60/049,191, filed Jun. 11, 1997.

TECHNICAL FIELD

This invention relates to electric oscillators and more particularly to an adjustable resonator or tank circuit for an electric oscillator operable at high frequencies for use at the Satellite Communication Bands (SATCOM) typically but not limited to 4.0–6.5 GHz.

BACKGROUND ART

In high frequency oscillators stray capacitances and lead inductances become very important in determining the oscillation frequency, output power, feedback fraction and other ac quantities. High frequency oscillators heretofore provided have an oscillator circuit board with a resonator or tank circuit in the form of a quarter wave transmission line section printed or etched on the circuit substrate, and a metal cover over the oscillator circuit. The capacitance between the resonator and the cover causes large cover frequency shift effects. The oscillator frequency is frequency modulated by microscopic movements of the cover caused by noise and vibration creating microphonic effects that appear as degraded electrical phase noise performance of the oscillator.

DISCLOSURE OF THE INVENTION

A resonator or tank circuit for an electric oscillator is disclosed. The resonator includes a substrate having a capacitance means and an inductance means. The substrate is adapted for mounting in a slot in an oscillator circuit board preferably substantially orthogonal or perpendicular to the oscillator board, and therefore orthogonal to a metal oscillator cover placed over the oscillator board to protect the circuit from external effects. The orthogonal mounting of the substrate relative to the cover reduces the microphonic cover effects. The capacitance and inductance of the resonator are each adjusted by removing tab portions or by laser trimming.

BRIEF DESCRIPTION OF THE DRAWINGS

Details of this invention are described in connection with the accompanying drawings in which like parts bear similar reference numerals in which:

FIG. 3 is a front elevation view of the resonator in FIG. 2.

FIG. 4 is a left side elevation view of the resonator in FIG. 2.

FIG. 5 is a right side elevation view of the resonator in FIG. 2.

FIG. 6 is a bottom elevation view of the resonator in FIG. 2.

FIG. 7A is a back elevation view of the resonator in FIG. 2.

FIG. 7B is an alternative back elevation view of the resonator in FIG. 2.

FIG. 8 is an electric schematic diagram of the L-C circuit of the resonator of FIG. 2.

FIG. 9 is a top plan view of the oscillator mother board into which the resonator of FIG. 2 is inserted for operation.

FIG. 10 is a front elevation view of the resonator in FIG. 2 being inserted into the oscillator mother board.

FIG. 11 is a front elevation view of an alternative resonator embodying features of the present invention.

FIG. 12 is a left side elevation view of the resonator in FIG. 11.

FIG. 13 is a right side elevation view of the resonator in FIG. 11.

FIG. 14 is a bottom elevation view of the resonator in FIG. 11.

FIG. 15 is a back elevation view of the resonator in FIG. 11.

FIG. 16 is an electric schematic diagram of the L-C circuit of the resonator of FIG. 11.

FIG. 17 is a front elevation view of another alternative resonator embodying features of the present invention.

FIG. 18 is a left side elevation view of the resonator in FIG. 17.

FIG. 19 is a right side elevation view of the resonator in FIG. 17.

FIG. 20 is a bottom elevation view of the resonator in FIG. 17.

FIG. 21 is a back elevation view of the resonator in FIG. 17.

FIG. 22 is an electric schematic diagram of the L-C circuit of the resonator of FIG. 17.

DETAILED DESCRIPTION OF THE INVENTION

Figure 1:
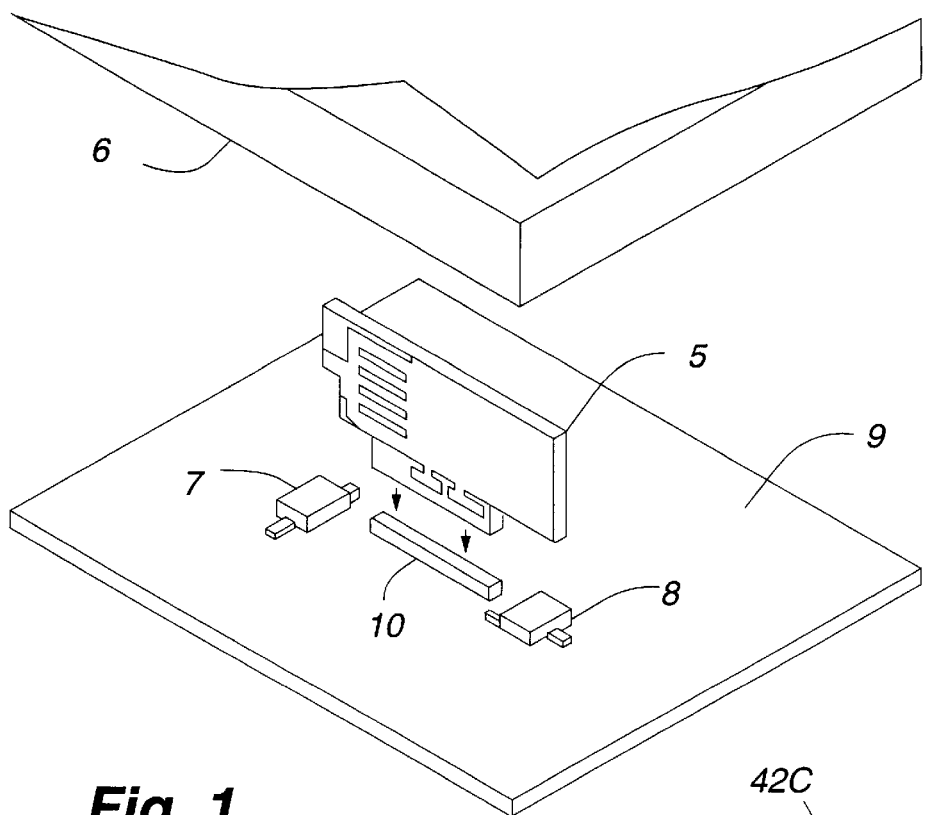
FIG. 1 is an exploded perspective view of an oscillator with a resonator embodying features of the present invention, the oscillator mother board into which the resonator is inserted for operation and an oscillator cover.
Figure 2:
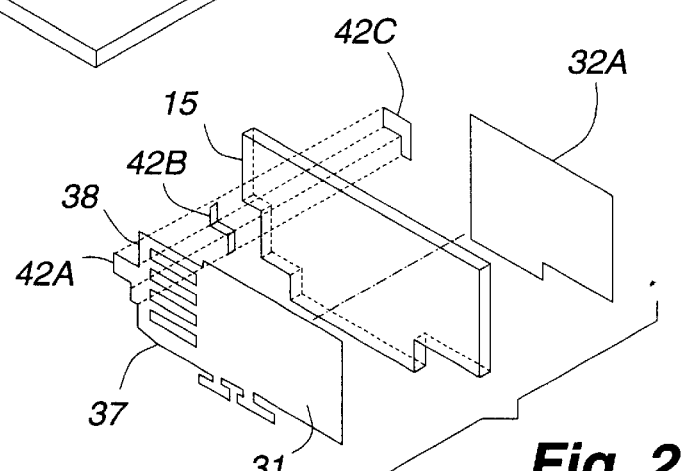
FIG. 2 is a perspective exploded view of a resonator embodying features of the present invention.

Referring to FIGS. 1–10, a resonator or tank circuit for an electric oscillator embodying features of this invention has a capacitance means 11 and an inductance means 12 mounted on dielectric substrate 15. Capacitance means 11 and inductance means 12 are electrically connected together in series in an L-C tank circuit. A schematic of the L-C tank circuit is shown in FIG. 8 with both inductance means 11 and capacitance means 12 being variable or adjustable to change the respective inductance and capacitance of the circuit.

Describing the specific embodiments herein chosen for illustrating the invention, certain terminology is used which will be recognized as being employed for convenience and having no limiting significance. For example, the terms "top" and "bottom" refer to the illustrated embodiment in its normal position of use. The terms "left" and "right" will refer to directions with references to the Figures.

Substrate 15 is of a rectangular shape having a front or first face 16, a back or second face 17 opposite first face 16, a left side edge 18, a right side edge 19, a top edge 20 and a bottom edge 21. A rectangular substrate tab portion 24 having tab bottom edge 25, tab left edge 26 and tab right edge 27 extends from substrate bottom edge 21 such that the intersection of substrate bottom edge 21 and tab left edge 26 forms a first shoulder 28, and the intersection of substrate bottom edge 21 and tab right edge 27 forms a second shoulder 29.

Capacitance means 11 has a rectangular first conductive portion or conductor 31 mounted on the substrate first face 16 adjacent to substrate right side edge 19 and bottom edge 21, and a rectangular second conductive portion or conductor 32A mounted on the substrate second face 17 opposite first plate 31. First conductor 31 and second conductor 32A are each made of a thin, low profile flat conductor, and in combination with substrate 15 form a first capacitor 30A.

FIG. 7B shows an alternative second conductor 32B. The alternative second conductor 32B has a plurality of conductor pads 22 and a plurality of conductive connectors 23 connecting pads 22. Pads 22 or connectors 23 are selectively removable to change or adjust the capacitance of first capacitor 30A.

A plurality of inverted T-shaped conductor tabs 33 extend on first face 16 from a first edge 34 of the first plate 31 onto tab 24. A rectangular conductor tab 36 extends on second face opposite T-shaped conductor tabs 33. T-shaped conductor tabs 33 in combination with conductor tab 36 form a plurality of second capacitors 30B so that capacitance means includes first capacitor 30A and second capacitors 30B connected in parallel. T-shaped conductor tabs 33 are selectively removable to change or adjust the capacitance of capacitance means 11.

A plurality of parallel spaced inductor bars 37 extend from a second edge 35 of first plate 31 toward substrate left side edge 18 on the same thin, flat conductor as capacitance means first conductor 31 and have a common connecting bar 38 connecting the opposite ends together to form the inductance means 12. Each bar 37 forms an inductor 39 so that inductance means 12 includes a plurality of inductors connected in parallel. Bars 37 are selectively removable to vary the inductance of inductance means 12.

A first terminal designated 40 includes a first terminal portion 42A extending on substrate first face 16 from connecting bar 38 to substrate left side edge 18, a second terminal portion 42B connected to and extending from first terminal portion 42A across substrate left side edge 18 to substrate second face 17, and a third terminal portion 42C connected to second terminal portion 42B and extending onto substrate second face 17 opposite first terminal portion 42A. A second terminal designated 41 is formed by the capacitance means second conductor 32A adjacent to the substrate right side edge 19.

Figure 23:
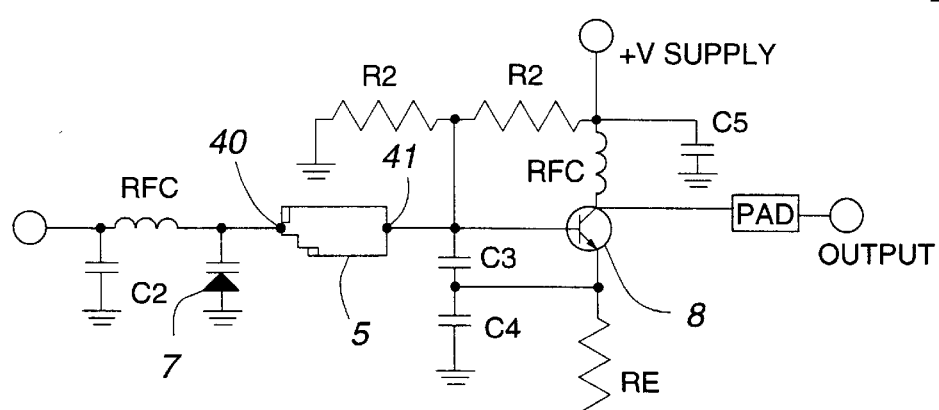
FIG. 23 is an electric schematic diagram of an oscillator circuit incorporating a resonator embodying features of the present invention.

Referring now to FIGS. 1, 9 and 10 the substrate 15 is shown mounted on and orthogonal to an oscillator mother board 9 with tab 24 extending through a slot 10 in the mother board 9. FIG. 23 shows the resonator 5 of the present invention in the oscillator circuit of oscillator mother board 9. The varactor 7 and the transistor 8 of the oscillator circuit are at opposite ends of slot 10 such that upon assembly of substrate 15 to mother board 9 first terminal 40 will be electrically connected, generally by soldering, to varactor 7 and second terminal 41 will be electrically connected, generally by soldering, to the base of transistor 8.

In this arrangement, the substrate is mounted in slot 10 in the mother board 9 which gives the advantage of repeatability of position relative to the other circuit elements and thereby improves production unit to unit uniformity. Although the slot 10 on mother board 9 and tab 24 on resonator 5 are provided in the preferred embodiment, the resonator 5 could also be mounted on the mother board 9 and supported orthogonal thereto without the tab 24 and slot 10 by the connection at first terminal 40 to varactor 7 and the connection at second terminal 41 to transistor 8. After assembly of the resonator 5 to the oscillator circuit and adjustment of resonator 5, cover 6 is placed over the mother board 9 to protect the oscillator from external elements. Due to the purposely thin top view profile of the resonator the capacitance is not materially affected by an oscillator cover 6 thereby reducing the cover microphonic effects.

Referring now to FIGS. 11–16 there is shown an alternative embodiment in which capacitance means 57 includes a discrete first capacitor 58. FIG. 16 shows a schematic of the resonator.

Substrate 43 has a front or first face 44, a back or second face 45 opposite first face 44, a left side edge 46, a right side edge 47, a top edge 48 and a bottom edge 49. A rectangular substrate tab portion 51 having tab bottom edge 52, tab left edge 53 and tab right edge 54 extends from substrate bottom edge 49 such that the intersection of substrate bottom edge 49 and tab left edge 53 forms a first shoulder 55, and the intersection of substrate bottom edge 49 and tab right edge 54 forms a second shoulder 56.

A capacitor mounting first pad 62 of thin, low profile flat conductor is mounted on substrate first face 44 intermediate substrate left side edge 46 and right side edge 47. A capacitor mounting second pad 63 of thin, low profile flat conductor is mounted on substrate first face 44 intermediate first pad 62 and substrate right side edge 47. First capacitor terminal 67 and second capacitor terminal 68 of discrete first capacitor 58 mount to and are generally soldered to first pad 62 and second pad 63, respectively.

A plated-through-hole or via 64 of thin conductive material extends through second pad 63 and through substrate 43 to second face 45. Conductor 66 of thin, low profile flat conductor is mounted on second face 45 and surrounds via 64 so that via 64 provides electrical connection from second pad 63 to conductor 66. A plurality of inverted T-shaped tabs 65 extend on first face 44 from first pad 62 onto tab 51. Conductor 66 extends along second face 45 onto substrate tab 51 opposite T-shaped tabs 65 so that conductor 66 and T-shaped tabs 65 form the plates of capacitors 59. T-shaped tabs 65 are selectively removable to change or adjust the capacitance of capacitance means 57.

A plurality of parallel spaced inductor bars 70 extend from first pad 63 toward substrate left side edge 46 and have a common connecting bar 71 connecting the opposite ends together to form the inductance means 60. Each bar 70 forms an inductor 69 so that inductance means 60 includes a plurality of inductors 69 connected in parallel. Bars 70 are selectively removable to change or adjust the inductance of inductance means 60.

A first terminal designated 73 includes a first terminal portion 75A extending on substrate first face 44 from connecting bar 71 to substrate left side edge 46, a second terminal portion 75B connected to and extending from first terminal portion 75A across substrate left side edge 46 to substrate second face 45, and a third terminal portion 75C connected to second terminal portion 75B and extending onto substrate second face 45 opposite first terminal portion 75A. A second terminal designated 74 is formed by the capacitance means conductor 66 adjacent to the substrate right side edge 47.

Referring now to FIGS. 17–22 another alternative embodiment of the resonator is shown with a capacitance means 76 and an inductance means 77 on substrate 79. Substrate 79 has a front or first face 80, a back or second face 81 opposite first face 80, a left side edge 82, a right side edge 83, a top edge 84 and a bottom edge 85. A rectangular substrate tab portion 87 having tab bottom edge 88, tab left edge 89 and tab right edge 90 extends from substrate bottom edge 85 such that the intersection of substrate bottom edge 85 and tab left edge 89 forms a first shoulder 91, and the intersection of substrate bottom edge 85 and tab right edge 90 forms a second shoulder 92.

Capacitance means 76 has a rectangular first conductor 94 mounted on the substrate first face 80 adjacent to substrate right side edge 83 and bottom edge 85, and a rectangular second conductor 95 mounted on substrate second face 81 opposite first conductor 94. First conductor 94 and second conductor 95 are each made of a thin, low profile flat conductor. First conductor 94 has a U-shaped cut away portion open toward top edge 84 forming capacitance means trim area 98 that is selectively trimmable with a laser to change or adjust the capacitance of capacitance means 76.

Inductance means 77 has a rectangular conductor 100 of a thin, low profile flat conductor mounted on the substrate first face 80 connected to and extending from the capacitance means first conductor 94 toward the substrate left side edge 82. Inductance means conductor 100 has a U-shaped cut away portion open toward the substrate top edge 84 forming inductance means trim area 101 that is selectively trimmable with a laser to change or adjust the inductance of inductance means 77.

A first terminal designated 103 includes a first terminal portion 105A extending on substrate first face 80 from inductance means conductor 100 to substrate left side edge 82, a second terminal portion 105B connected to and extending from first terminal portion 105A across substrate left side edge 82 to substrate second face 81, and a third terminal portion 105C connected to second terminal portion 105B and extending onto substrate second face 81 opposite first terminal portion 105A. A second terminal designated 104 is formed by the capacitance means second conductor 95 adjacent to the substrate right side edge 83.

The device is adjusted using a laser trim to a precise frequency by a servo turn off. The capacitance is trimmed first for power output and the inductance and/or capacitance is then trimmed for frequency. This continuous laser trim arrangement lends itself to automatic servo control trimming. FIG. 22 shows a schematic of the L-C tank circuit including variable capacitance means 76 and variable inductance means 77. The above described resonators have been found to operate in a frequency range of about 4.0 to 6.5 GHz.

Although the present invention has been described with a certain degree of particularity, it is understood that the present disclosure has been made by way of example and that changes in details of structure may be made without departing from the spirit thereof.

What is claimed is:

1. A resonator for an electric oscillator comprising:
   a substrate having opposed first and second faces, and means for mounting said substrate substantially orthogonal to an oscillator board,
   capacitance means on said substrate, said capacitance means having a first conductor on said first face and a second conductor on said second face,
   inductance means having a third conductor on said first face connected to said first conductor, thereby connecting said inductance means in series with said capacitance means.

2. The resonator as set forth in claim 1 wherein said inductance means is formed by a plurality of spaced conductive bars, said bars being interconnected along a first end of each bar and interconnected along a second end of each bar, said bars being selectively removable to change the inductance of said inductance means.

3. The resonator as set forth in claim 1 wherein said inductance means includes a conductive substantially U-shaped portion, said U-shaped portion being trimmable to change the inductance of said inductance means.

4. The resonator as set forth in claim 1 that operates in the frequency range of about 4.0 to 6.5 GHz.

5. The resonator as set forth in claim 1 wherein said first conductor has a plurality of tabs connected thereto, said tabs being selectively removable to vary the capacitance of said capacitance means.

6. The resonator as set forth in claim 1 wherein said first conductor has a U-shaped portion, said U-shaped portion being selectively trimmable to vary the capacitance of said capacitance means.

7. The resonator as set forth in claim 1 wherein said capacitance means includes a discrete surface mount capacitor mounted on said substrate and said substrate has a via connecting said surface mount capacitor to said second conductor.

8. The resonator as set forth in claim 1 wherein said mounting means includes a tab extending from said substrate adapted to fit into a slot in said oscillator board for uniformity of location.

9. A resonator for an electric oscillator comprising:
   a dielectric substrate having opposed planar first and planar second faces, and a tab extending along an edge adapted to fit into a slot in an oscillator board for mounting said substrate orthogonal to said oscillator board,
   inductance means on said first face having a plurality of parallel spaced bars of conductive material, said bars being interconnected along a first end of each bar and interconnected along a second end of each bar opposite said first end, said bars being selectively removable to adjust the inductance of said inductance means, said inductance means having a first terminal for connection in an oscillator circuit, and
   capacitance means on said substrate connected to said inductance means, said capacitance means having a first conductor on said first face and a second conductor on said second face, said first conductor having a plurality of tabs connected thereto, said tabs being selectively removable to vary the capacitance of said capacitance means, said capacitance means having a second terminal for connection in said oscillator circuit.

10. A resonator for an electric oscillator comprising:
    a dielectric substrate having opposed planar first and planar second faces, and a tab extending from an edge of said substrate adapted to fit into a slot in an oscillator board for mounting said substrate orthogonal to the oscillator board,
    inductance means on said first face including a plurality of parallel spaced bars of conductive material, said bars being interconnected along a first end of each bar and interconnected along a second end of each bar opposite said first end, said bars being selectively removable to adjust the inductance of said inductance means, said inductance means having a first terminal for connection in an oscillator circuit, and
    capacitance means having a discrete surface mount capacitor mounted on said first face and connected to said inductance means, said capacitance means having a second terminal for connection in said oscillator circuit.

11. A resonator comprising:
    a substrate having opposed planar first and planar second faces, and a tab extending from an edge of said substrate adapted to fit into a slot in an oscillator board for mounting said substrate orthogonal to the oscillator board, inductance means on said first face having a U-shaped portion of conductive material, said U-shaped portion being trimmable to adjust the inductance of said inductance means, said inductance means having a first terminal for connection in an oscillator circuit, and capacitance means on said substrate connected to said inductance means, said capacitance means including a first conductor on said first face forming a capacitor first plate, a second conductor on said second face forming a capacitor second plate and a capacitor dielectric formed by said substrate between said first and second plates, said first conductor having a U-shaped portion, said U-shaped portion being selectively trimmable to vary the capacitance of said capacitance means, said capacitance means having a second terminal for connection in said oscillator circuit.

12. An electric oscillator comprising:

an oscillator board, an oscillator cover mounted over said oscillator board, and a resonator mounted on said oscillator board inside said oscillator cover, said resonator including a substrate having opposed planar first and planar second faces orthogonal to said oscillator board, inductance means on said first face, said inductance means having a first terminal for connection to said oscillator board, and capacitance means on said substrate connected to said inductance means, said capacitance means having a first conductor parallel to said first face, a second conductor parallel to said first face and a dielectric between said first and second conductors, said capacitance means having a second terminal for connection to said oscillator board.

13. The oscillator as set forth in claim 12 wherein said inductance means has a plurality of parallel spaced bars of conductive material, said bars being interconnected along a first end of each bar and interconnected along a second end of each bar opposite said first end, said bars being selectively removable to adjust the inductance of said inductance means.

14. The oscillator as set forth in claim 12 wherein said inductance means has by a substantially U-shaped portion of conductive material, said U-shaped portion being trimmable to adjust the inductance of said inductance means.

15. The oscillator as set forth in claim 12 wherein said first conductor has a plurality of tabs connected thereto, said tabs being selectively removable to vary the capacitance of said capacitance means.

16. The oscillator as set forth in claim 12 wherein said first conductor has a U-shaped portion, said U-shaped portion being selectively trimmable to vary the capacitance of said capacitance means.

17. The oscillator as set forth in claim 12 wherein said capacitance means includes a discrete surface mount capacitor mounted on said first face and said substrate has a via connecting said capacitor to said second terminal.

18. The oscillator as set forth in claim 12 wherein said substrate includes a tab extending therefrom, and said oscillator board has a slot therein, said substrate tab extending through said slot to mount said resonator to said oscillator board.

* * * * *